United States Patent
Iwahori

(10) Patent No.: US 9,206,527 B2
(45) Date of Patent: Dec. 8, 2015

(54) CARBON THIN FILM, MOLD FOR MOLDING OPTICAL ELEMENT, AND METHOD FOR MANUFACTURING OPTICAL ELEMENT

(71) Applicant: NIKON CORPORATION, Tokyo (JP)

(72) Inventor: Koichiro Iwahori, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 122 days.

(21) Appl. No.: 13/859,246

(22) Filed: Apr. 9, 2013

(65) Prior Publication Data

US 2013/0221548 A1    Aug. 29, 2013

Related U.S. Application Data

(63) Continuation of application No. PCT/JP2011/075432, filed on Nov. 4, 2011.

(30) Foreign Application Priority Data

Nov. 9, 2010   (JP) ................................. 2010-250679

(51) Int. Cl.

| | |
|---|---|
| *C23C 14/06* | (2006.01) |
| *C30B 29/02* | (2006.01) |
| *B29C 33/56* | (2006.01) |
| *C03B 11/08* | (2006.01) |
| *C23C 14/46* | (2006.01) |

(Continued)

(52) U.S. Cl.
CPC .................. *C30B 29/02* (2013.01); *B29C 33/56* (2013.01); *C01B 31/02* (2013.01); *C03B 11/086* (2013.01); *C23C 14/0605* (2013.01); *C23C 14/46* (2013.01); *B29K 2907/04* (2013.01); *B29L 2011/00* (2013.01); *C03B 2215/24* (2013.01); *C03B 2215/31* (2013.01); *Y10T 428/2495* (2015.01); *Y10T 428/30* (2015.01)

(58) Field of Classification Search
USPC ...................... 428/216, 217, 408; 249/114.1; 65/374.15
See application file for complete search history.

(56) References Cited

U.S. PATENT DOCUMENTS 7,947,372 B2 *   5/2011   Dekempeneer ............... 428/408
7,955,691 B2 *   6/2011   Moronuki et al. ............ 428/216

(Continued)

FOREIGN PATENT DOCUMENTS

| CN | 101432462 A | 5/2009 |
|---|---|---|
| JP | 2002-322555 | * 11/2002 |

(Continued)

OTHER PUBLICATIONS

Office Action issued in Chinese Patent Application No. 201180039247.9 dated Jul. 3, 2014 (with translation).

(Continued)

*Primary Examiner* — Archene Turner
(74) *Attorney, Agent, or Firm* — Oliff PLC

(57) ABSTRACT

A ta-C thin film (1A) is formed by laminating a first unit structure (11) and a second unit structure (12) in this order on a base material (10). The first unit structure (11) has mutually different amounts of $sp^3$ bonding in a first layer (11a) and a second layer (11b), and has mutually different amounts of $sp^3$ bonding in the second layer (11b) and a third layer (11c). The second unit structure (12) has mutually different amounts of $sp^3$ bonding in a first layer (12a) and a second layer (12b), and has mutually different amounts of $sp^3$ bonding in the second layer (12b) and a third layer (12c).

6 Claims, 7 Drawing Sheets

(51) Int. Cl.
*C01B 31/02* (2006.01)
*B29L 11/00* (2006.01)

(56) References Cited

U.S. PATENT DOCUMENTS

| | | | |
|---|---|---|---|
| 8,304,063 B2 * | 11/2012 | Ito et al. | 428/217 |
| 8,501,673 B2 * | 8/2013 | Suzuki et al. | 508/509 |
| 8,652,620 B2 * | 2/2014 | Fischer et al. | 428/212 |
| 2008/0220257 A1 | 9/2008 | Dekempeneer | |
| 2009/0011225 A1 | 1/2009 | Moronuki et al. | |

FOREIGN PATENT DOCUMENTS

| | | | |
|---|---|---|---|
| JP | 2002-269991 | * | 9/2004 |
| JP | A-2007-169698 | | 7/2007 |
| JP | A-2008-1951 | | 1/2008 |
| JP | 2008-081630 | * | 4/2008 |

OTHER PUBLICATIONS

Office Action issued in Chinese Patent Application No. 2011800392479 dated Apr. 3, 2014 (with translation).
Feb. 7, 2012 International Search Report issued in International Application No. PCT/JP2011/075432 (with translation).
Feb. 7, 2012 Written Opinion issued in International Application No. PCT/JP2011/075432 (with translation).

* cited by examiner

FIG. 7A

| |
|---|
| −66V (25nm) |
| −660V (25nm) |
| −1980V (25nm) |
| −66V (25nm) |
| −660V (25nm) |
| −1980V (25nm) |
| −66V (25nm) |
| −660V (25nm) |
| −1980V (25nm) |
| −66V (25nm) |
| −660V (25nm) |
| −1980V (25nm) |
| SILICON WAFER |

FIG. 7B

| |
|---|
| −660V (25nm) |
| −66V (25nm) |
| −660V (25nm) |
| −1980V (25nm) |
| −660V (25nm) |
| −66V (25nm) |
| −660V (25nm) |
| −1980V (25nm) |
| −660V (25nm) |
| −66V (25nm) |
| −660V (25nm) |
| −1980V (25nm) |
| SILICON WAFER |

US 9,206,527 B2

CARBON THIN FILM, MOLD FOR MOLDING OPTICAL ELEMENT, AND METHOD FOR MANUFACTURING OPTICAL ELEMENT

CROSS-REFERENCE TO RELATED APPLICATION

This is a Continuation Application of International Application No. PCT/JP2011/075432, filed Nov. 4, 2011, which claims priority to Japanese Patent Application No. 2010-250679 filed on Nov. 9, 2010. The contents of the aforementioned applications are incorporated herein by reference.

BACKGROUND

1. Field of the Invention

The present invention relates to a carbon thin film made of tetrahedral amorphous carbon, which is for protecting a base material, a mold for molding an optical element having the carbon thin film on the surface, and a method for manufacturing an optical element in which the mold for molding an optical element is used.

2. Description of Related Art

A carbon thin film made of tetrahedral amorphous carbon (hereinafter, sometimes abbreviated to a ta-C thin film) is put into practical use as a film that protects the base material of a mold, a drill, and the like.

In addition, as a method for forming the ta-C thin film, an ion plating method, including arc ion plating, in which carbon ions are deposited on the base material using a bias voltage applied to the base material, is mainly applied. According to this film-forming method, since many of $sp^3$ bonding ($sp^3$ bonds), which are bonds between carbon atoms that form a diamond, can be included as bonds between carbon atoms in the ta-C thin film, it is possible to make the ta-C thin film into an extremely hard (high hardness) film.

In the ta-C thin film including $sp^3$ bonds, carbon atoms form a strong network of the $sp^3$ bonds in a small area, but, in view of a large area, an order less amorphous structure is formed, and therefore the surface becomes extremely flat and smooth compared to a thin film made of a crystal having a wholly-ordered structure, and the coefficient of friction becomes as extremely small as 0.1 or less. As such, since the ta-C thin film can form a flat and smooth film having an extremely high hardness on a base material, the ta-C thin film is preferable as a protective film for the portions of a mold, a drill, or the like which slide on work pieces, and is widely used.

However, since a high-hardness ta-C thin film has an extremely large internal stress (compressive stress), there is a problem in that, when a shock (contact shock) or a thermal shock is applied from the outside, its own internal stress is released, and the ta-C thin film becomes liable to be peeled off from the base material. In addition, when an excessively thick film is formed, the internal stress further increases, and therefore the ta-C film becomes more liable to be peeled off. Therefore, it is not possible to employ a method for simply increasing the film thickness for the purpose of improving the durability, which is an extension of a period of time during which the thin film is abraded due to sliding on work pieces so as to be removed on the base material. In order to suppress the peeling of the ta-C thin film from the base material, it is considered to decrease the amount of the $sp^3$ bonding in the ta-C thin film so as to decrease the internal stress, and to increase the adhesion with the base material. However, according to this method, the hardness of the thin film also decreases at the same time, and therefore it is not possible to improve abrasion resistance. As such, it is extremely difficult to improve abrasion resistance in a ta-C thin film having a uniform amount of the $sp^3$ bonding.

In the present specification, the "amount of the $sp^3$ bonding" refers to the percentage of the number of the $sp^3$ bonding in the total number of $sp^2$ bonding and the $sp^3$ bonding in the ta-C thin film.

Thus far, as a method for manufacturing a ta-C thin film, a method has been disclosed in which, when the ta-C thin film is formed on a base material, mixing between the base material and the thin film is strengthened by increasing a bias voltage, furthermore, another thin film having a large amount of $sp^3$ bonding and a high hardness is formed on the thin film so as to produce a bilayer-structured ta-C thin film, and thus, adhesion with the base material is improved (refer to Japanese Unexamined Patent Application, First Publication No. 2007-169698). In addition, a method is disclosed in which a ta-C thin film structured by alternately laminating two layers having different amounts of $sp^3$ bonding is produced, and abrasion resistance is improved (refer to Japanese Unexamined Patent Application, First Publication No. 2008-1951).

SUMMARY

However, since the use of the ta-C thin film is diversified, and, for some uses, it was not possible to obtain a sufficient abrasion resistance using a ta-C thin film of the related art, there was a demand for a new ta-C thin film in which the hardness is high and peeling off from a base material is suppressed.

An object of an aspect of the invention is to provide a ta-C thin film in which the hardness is high and peeling off from a base material is suppressed, a mold for molding an optical element having the thin film on the surface, and a method for manufacturing an optical element in which the mold for molding an optical element is used.

A first aspect of the invention is a carbon thin film made of tetrahedral amorphous carbon (ta-C thin film) having a plurality of unit structures in which three or more layers having mutually different amounts of $sp^3$ bonding in adjacent layers are laminated in the film thickness direction (excluding a unit structure in which two layers having different amounts of $sp^3$ bonding are alternately laminated).

A second aspect of the invention is a mold for molding an optical element having the carbon thin film according to the first aspect on the surface.

A third aspect of the invention is a method for manufacturing an optical element in which a subject to be molded is pressurized using the mold for molding an optical element of the second aspect so as to form an optical element.

According to the aspects of the invention, it is possible to provide a ta-C thin film in which the hardness is high and peeling off from a base material is suppressed, a mold for molding an optical element having the thin film on the surface, and a method for manufacturing an optical element in which the mold for molding an optical element is used.

BRIEF DESCRIPTION OF THE DRAWINGS

FIG. 7A is a schematic view showing a carbon thin film manufactured in Example 2.

FIG. 7B is a schematic view showing a carbon thin film manufactured in Example 6.

DESCRIPTION OF EMBODIMENTS

A carbon thin film of the present embodiment (hereinafter, sometimes, abbreviated to a "ta-C thin film" or simply a "thin film") is characterized in that having a plurality of unit structures, which has three or more layers having mutually different amounts of $sp^3$ bonding ($sp^3$ bonds) in adjacent layers laminated, in a film thickness direction (excluding a unit structure in which two layers having different amounts of $sp^3$ bonding are alternately laminated).

In the thin film of the present embodiment, a state is formed in which $sp^3$ bonding and $sp^2$ bonding coexist as the bonding between carbon atoms. In this state, when a specific distribution of the amounts of the $sp^3$ bonding, that is, having a plurality of the unit structures in the film thickness direction is formed, a thin film for which peeling from a base material is suppressed while maintaining a high hardness can be obtained. However, the thin film of the present embodiment does not include a unit structure in which two layers having different amounts of, $sp^3$ bonding are alternately laminated. Here, the "two layers being alternately laminated" represents that the two mutually different layers are laminated continuously and repeatedly two or more times.

In the respective layers that configure the unit structures, the amount of the $sp^3$ bonding is uniform, and there is no evident distribution in the film thickness direction. Here, the "uniform amount of the $sp^3$ bonding" includes not only a case in which the amount of the $sp^3$ bonding is entirely the same but also a case in which at least an evident distribution of the amount of the $sp^3$ bonding is not shown. Such layers can be readily formed with no change by maintaining the film-forming conditions constant in a manufacturing method described below.

The amount of the $sp^3$ bonding can be confirmed using, for example, X-ray photoelectron spectroscopy (XPS). In the spectrum obtained using XPS, the overlapped C1s-derived peaks are detected for the $sp^3$ bonding component and the $sp^2$ bonding component. The peaks of the $sp^3$ bonding component and the $sp^2$ bonding component are separated, and the amount ratio between the $sp^3$ bonding and the $sp^2$ bonding can be obtained from the area ratio between the respective separated peaks.

Figure 1:
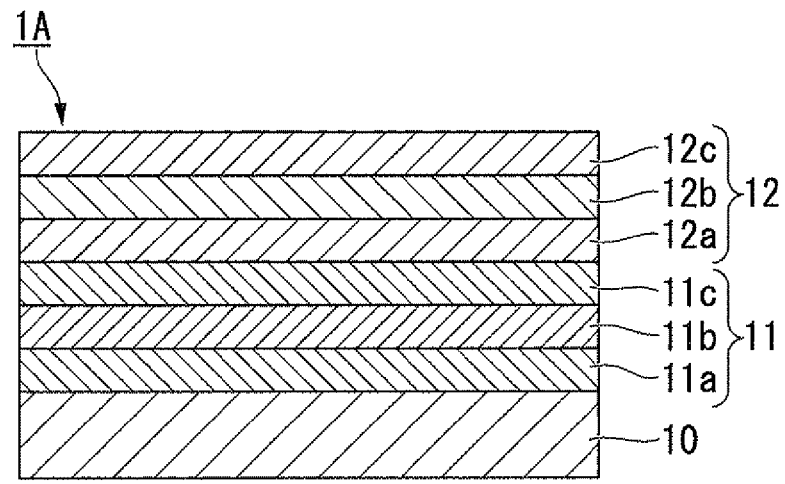
FIG. 1 is a schematic cross-sectional view showing an example of a carbon thin film of the present embodiment.

FIG. 1 is a schematic cross-sectional view showing an example of a thin film of the present embodiment.

A thin film 1A shown here is formed by laminating a first unit structure 11 and a second unit structure 12 in this order on a base material 10. That is, the number of the unit structures that configure the thin film is 2.

The first unit structure 11 is formed by laminating a first layer 11a, a second layer 11b, and a third layer 11c in this order from the bottom side (the side of the base material 10), that is, configured with three layers. In addition, the amounts of the $sp^3$ bonding are mutually different in two adjacent layers. That is, the amount of the $sp^3$ bonding are mutually different in the first layer 11a and the second layer 11b, and are mutually different in the second layer 11b and the third layer 11c.

Similarly, the second unit structure 12 is formed by laminating a first layer 12a, a second layer 12b, and a third layer 12c in this order from the bottom side (the side of the base material 10), that is, configured with three layers. In addition, the amounts of the $sp^3$ bonding are mutually different in two adjacent layers. That is, the amount of the $sp^3$ bonding are mutually different in the first layer 12a and the second layer 12b, and are mutually different in the second layer 12b and the third layer 12c.

The first unit structure 11 and the second unit structure 12 may be the same or may be different. Meanwhile, in the present specification, the "same unit structure" represents that the number of layers that configure the unit structure is the same, and the amounts of the $sp^3$ bonding and thicknesses of the respective layers (the first layer, the second layer, . . . ) laminated from the bottom side (the side of the base material 10) toward the top side (the side away from the base material 10) are the same.

In the first unit structure 11, it is preferable that the amounts of the $sp^3$ bonding be less than 65% in any one of the first layer 11a, the second layer 11b, and the third layer 11c, be 65% to less than 75% in another, and be 75% or more in the other. In addition, in the layer for which the amount of the $sp^3$ bonding is less than 65%, the lower limit value of the amount is preferably 50%. In addition, in the layer for which the amount of the $sp^3$ bonding is 75% or more, the upper limit of the amount is preferably 85%.

In the first unit structure 11, the amount of the $sp^3$ bonding in the first layer 11a is preferably lowest since the adhesion to the base material 10 further improves. In addition, the first unit structure is preferably configured to have the amounts of the $sp^3$ bonding, which increase in the first layer 11a, the second layer 11b, and the third layer 11c sequentially since the abrasion resistance of the entire thin film 1A further improves. That is, a particularly preferable example of the first unit structure 11 has the amounts of the $sp^3$ bonding of less than 65% in the first layer, 65% to less than 75% in the second layer, and 75% or more in the third layer.

The amounts of the $sp^3$ bonding in the second unit structure 12 can be set in the same manner as in the case of the first unit structure 11.

The first layer 11a to the third layer 11c in the first unit structure 11 and the first layer 12a to the third layer 12c in the second unit structure 12 all preferably have a thickness of 1 nm to 60 nm.

Figure 2:
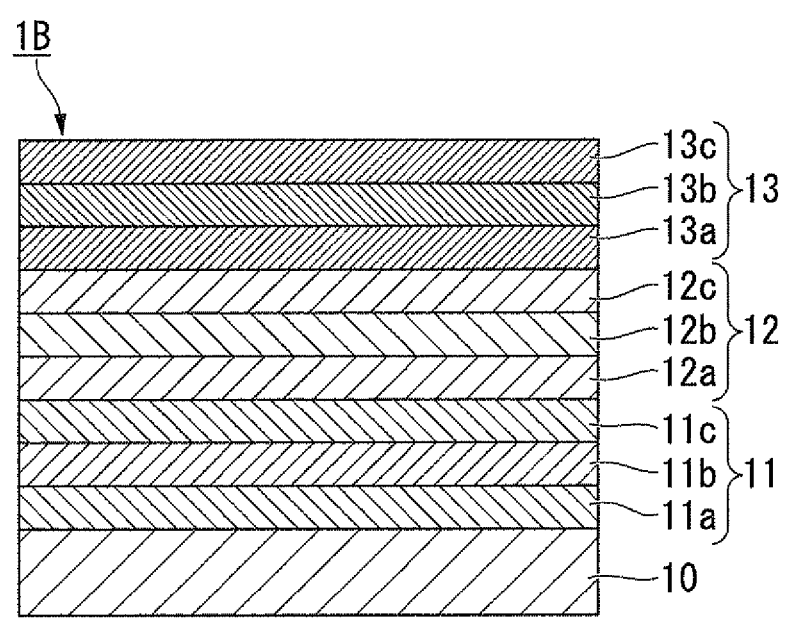
FIG. 2 is a schematic cross-sectional view showing an example of the carbon thin film of the embodiment.

FIG. 2 is a schematic cross-sectional view showing another example of the thin film of the embodiment.

A thin film 1B shown here is the thin film 1A shown in FIG. 1 in which the number of the unit structures becomes three. That is, a third unit structure 13 is further laminated on the second unit structure 12.

The third unit structure 13 is formed by laminating a first layer 13a, a second layer 13b, and a third layer 13c in this order from the bottom side (the side of the base material 10), that is, configured with three layers. In addition, the amounts of the $sp^3$ bonding are mutually different in two adjacent layers. That is, the amount of the $sp^3$ bonding are mutually different in the first layer 13a and the second layer 13b, and are mutually different in the second layer 13b and the third layer 13c.

In the third unit structure 13, the amounts of the $sp^3$ bonding and the thicknesses can be set in the same manner as in the first unit structure 11 and the second unit structure 12. In addition, the third unit structure may be the same as or different from the first unit structure 11. Similarly, the third unit structure may be the same as or different from the second unit structure 12.

The thin film 1B is the same as the thin film 1A except that the third unit structure 13 is provided.

Thus far, cases in which the numbers of the unit structure configured with three layers are two (the thin film 1A) and three (the thin film 1B) have been described, but the number of the unit structures is not particularly limited as long as the number is two or more, and can be appropriately adjusted depending on the amounts of the $sp^3$ bonding in the respective layers and purposes. However, the number of the unit structures is preferably 2 to 30 in consideration of availability, ease of manufacturing, and the like.

The thin films of the present embodiment preferably have a large number of the unit structures in which the amounts of the $sp^3$ bonding in the first layer to the third layer are set in the above preferable range, and are most preferably configured only with such unit structures.

In addition, the unit structures are preferably all the same, and as such, when the unit structures having the same configuration are laminated in the film thickness direction, and the hardness varies periodically in the film thickness direction, superior effects of the invention can be obtained.

Figure 3:
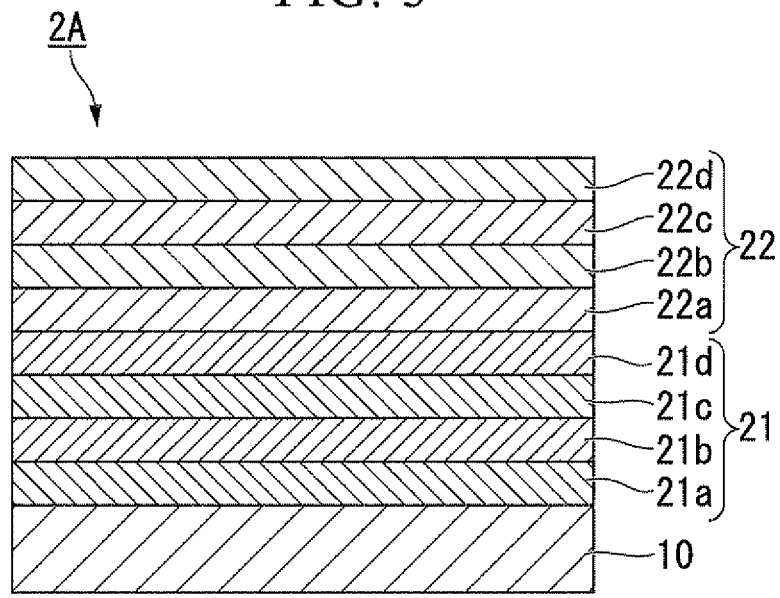
FIG. 3 is a schematic cross-sectional view showing an example of the carbon thin film of the embodiment.

FIG. 3 is a schematic cross-sectional view showing another example of the thin film of the embodiment.

A thin film 2A shown here is formed by laminating a first unit structure 21 and a second unit structure 22 in this order on the base material 10. That is, the number of the unit structures that configure the thin film is two.

The first unit structure 21 is formed by laminating a first layer 21a, a second layer 21b, a third layer 21c, and a fourth layer 21d in this order from the bottom side (the side of the base material 10), that is, configured with four layers. In addition, in the first unit structure 21, the amounts of the $sp^3$ bonding are mutually different in two adjacent layers. That is, the amount of the $sp^3$ bonding are mutually different in the first layer 21a and the second layer 21b, are mutually different in the second layer 21b and the third layer 21c, and are mutually different in the third layer 21c and the fourth layer 21d.

Similarly, the second unit structure 22 is formed by laminating a first layer 22a, a second layer 22b, a third layer 22c, and a fourth layer 22d in this order from the bottom side (the side of the base material 10), that is, configured with four layers. In addition, the amounts of the $sp^3$ bonding are mutually different in two adjacent layers. That is, the amount of the $sp^3$ bonding are mutually different in the first layer 22a and the second layer 22b, are mutually different in the second layer 22b and the third layer 22c, and are mutually different in the third layer 22c and the fourth layer 22d.

The first unit structure 21 and the second unit structure 22 may be the same, or may be different.

The thin film 2A is the same as the thin film 1A except that the first and second unit structures are not three layers, but four layers.

For example, in the first unit structure 21, the amounts of the $sp^3$ bonding in the first layer 21a, the second layer 21b, and the third layer 21c may be the same as the case of the first layer 11a, the second layer 11b, and the third layer 11c in the thin film 1A, respectively. In addition, the amount of the $sp^3$ bonding in the fourth layer 21d is not particularly limited, but is preferably the same as in the second layer 21b.

Therefore, a particularly preferable example of the first unit structure 21 has the amounts of the $sp^3$ bonding of less than 65% in the first layer, 65% to less than 75% in the second layer, 75% or more in the third layer, and 65% to less than 75% in the fourth layer.

In the thin film 2A, the amounts of the $sp^3$ bonding in the second unit structure 22 can be set in the same manner as in the case of the first unit structure 21.

Thus far, a case in which the number of the unit structures configured with four layers is two has been described, but the number of the unit structures is not particularly limited as long as the number is two or more, and can be appropriately adjusted depending on the amounts of the $sp^3$ bonding in the respective layers and purposes. However, the number of the unit structures is preferably 2 to 30 in consideration of availability, ease of manufacturing, and the like.

The thin films of the present embodiment preferably have a large number of the unit structures in which the amounts of the $sp^3$ bonding in the first layer to the fourth layer are set in the above preferable range, and are most preferably configured only with such unit structures.

Figure 4:
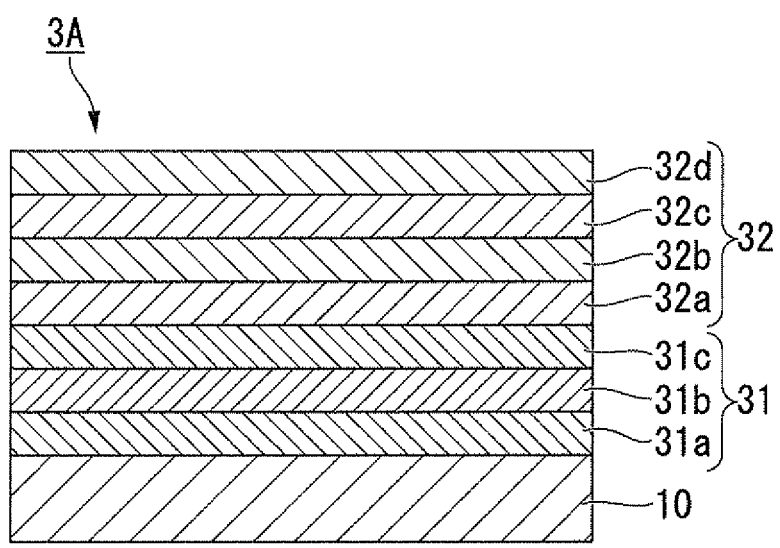
FIG. 4 is a schematic cross-sectional view showing an example of the carbon thin film of the embodiment.

FIG. 4 is a schematic cross-sectional view showing another example of the thin film of the present embodiment.

A thin film 3A shown here is formed by laminating a first unit structure 31 and a second unit structure 32 in this order on the base material 10. That is, the number of the unit structures that configure the thin film is two.

The first unit structure 31 is formed by laminating a first layer 31a, a second layer 31b, and a third layer 31c in this order from the bottom side (the side of the base material 10), that is, configured with three layers. In addition, the second unit structure 32 is formed by laminating a first layer 32a, a second layer 32b, a third layer 32c, and a fourth layer 32d in this order from the bottom side (the side of the base material 10), that is, configured with four layers.

The thin film 3A is the same as the thin film 1A except that the second unit structure is not three layers, but four layers.

For example, in the first unit structure 31, the amounts of the $sp^3$ bonding in the first layer 31a, the second layer 31b, and the third layer 31c can be set in the same manner as in the case of the first layer 11a, the second layer 11b, and the third layer 11c in the first unit structure 11 of the thin film 1A, respectively. In addition, in the second unit structure 32, the amounts of the $sp^3$ bonding in the first layer 32a, the second layer 32b, the third layer 32c, and the fourth layer 32d can be set in the same manner as in the case of the first layer 21a, the second layer 21b, the third layer 21c, and the fourth layer 21d in the first unit structure 21 of the thin film 2A, respectively.

In addition, for example, the number of the unit structures is not particularly limited as long as the number is two or more, and can be appropriately adjusted depending on the amounts of the $sp^3$ bonding in the respective layers and purposes.

Thus far, cases in which the numbers of the layers in the respective unit structures are three or four have been described, but the numbers of the layers in the unit structures are not particularly limited as long as the numbers are three or more, and can be appropriately adjusted depending on purposes. However, the numbers of the layers in the unit structures are preferably 3 to 5 in consideration of availability, ease of manufacturing, and the like.

The thin films of the present embodiment preferably have a hardness of 27 GPa to 40 GPa (gigapascal). In addition, the internal stress is preferably −2.2 GPa to −1.0 GPa (gigapascal). Also, both the hardness and the internal stress are particularly preferably in the above ranges.

The hardness of the thin film can be measured using a nanoindentation method. In addition, the internal stress of the thin film can be calculated by measuring the amount of the base material deformed after forming the thin film and performing calculation using the Stoney formula.

In the thin films of the present embodiment, the film thickness of each of the unit structures is preferably ⅓ or less of the total film thickness, and more preferably ⅕ or less. In addition, a larger number of the unit structures preferably satisfy the film thickness condition, and all of the unit structures most preferably satisfy the film condition.

In the ta-C thin films of the present embodiment described above, compared to a bilayer-structured ta-C thin film, the distribution of the internal stress is averaged throughout the entire thin film, and therefore the abrasion resistance is superior. Furthermore, in the ta-C thin films of the present embodiment, compared to a ta-C thin film structured by alternately laminating two layers having different amounts of $sp^3$ bonding, the hardness changes abruptly only in small portions, and therefore the abrasion resistance is superior.

The thin films of the present embodiment can be manufactured using a well-known method, for example, ion plating or the like.

Figure 5:
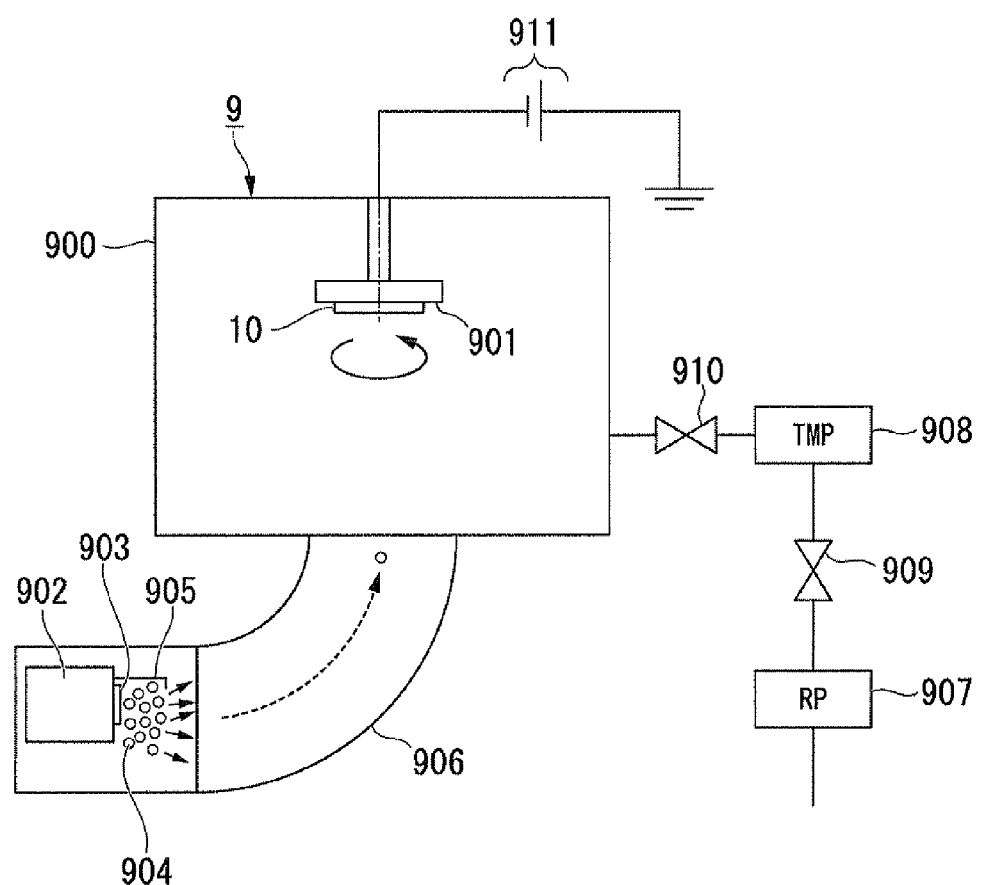
FIG. 5 is a schematic configuration view exemplifying a film-forming apparatus for manufacturing the carbon thin film of the embodiment.

FIG. 5 is a schematic configuration view exemplifying a film-forming apparatus for manufacturing the thin film of the present embodiment. A film-forming apparatus 9 shown here has a film-forming chamber 900, a cathode 902, a target 903, a trigger 905, an electromagnetic filter 906, a rotary pump 907, a turbo molecular pump 908, a first valve 909, a second valve 910, and a voltage source 911.

The film-forming chamber 900 is a vacuum vessel that forms a thin film on the base material 10, and has a base material holder 901 inside. In addition, a load lock chamber (not shown) may be connected to the film-forming chamber 900. Since the inside of the film-forming chamber 900 is generally maintained in a vacuum state, it is possible to further suppress incorporation of impurities into a formed thin film by entering and removing the base material 10 using a load lock method before and after film formation.

The base material holder 901 holds the base material 10 in a film-forming process, and generally, the base material 10 is held so that the surface on which the thin film is made to grow faces downward. The base material holder 901 is preferably rotatable around, for example, its central axis as the rotation axis as shown by the arrow in the drawing. A more uniform thin film can be formed on the base material 10 by rotating the base material holder 901 in the film-forming process so as to rotate the base material 10.

The base material holder 901 may have temperature-adjusting device. When the base material holder 901 is heated in the film-forming process, the base material 10 is heated so as to accelerate thermal diffusion of atoms that configure the thin film, and a more uniform thin film can be formed on the base material 10.

The voltage source 911 is electrically connected to the film-forming chamber 900, and a bias voltage is applied to the base material 10. Here, a direct current voltage source is shown as the voltage source 911, but the voltage source may be an alternative current voltage source. When a bias voltage is applied to the base material 10, the energy of ions incident on the surface of the base material 10 is controlled, and diffusion of incident ions into the inside from the surface of a growing thin film and diffusion of atoms in the thin film which receives energy from the incident ions are accelerated, whereby a uniform thin film can be formed.

The cathode 902 is provided at the bottom of the film-forming chamber 900 through the electromagnetic filter 906, and fixes the carbon target 903 which serves as a supply source of carbon ions during film formation. In addition, the trigger 905 is provided at the vicinity of the target 903.

The film-forming apparatus is configured so that, during film formation, a current is applied in a state in which the trigger 905 is brought into contact with the surface of the target 903, and subsequently, an arc discharge is generated between the target 903 and the trigger 905 by separating the trigger 905 from the target 903. In addition, particles in a variety of states, such as carbon ions, neutral atoms, clusters, and macro-particles, are generated from the target 903 using the arc discharge, and among the particles, carbon ions 904 are supplied to the base material 10, whereby a thin film can be formed. At this time, since the carbon ions 904 have a variety of energies, in order to form a more uniform high-quality thin film, it is preferable to supply the carbon ions 904 having the same or similar energy. In order to supply the carbon ions having the same or similar energy, it is preferable to adjust the magnetic intensity using the electromagnetic filter 906 so as to allow the carbon ions 904 having the same or similar energy pass through. The carbon ions 904 selected using the electromagnetic filter 906 are appropriately accelerated or decelerated by adjusting the bias voltage applied to the base material 10, and consequently, the amount of the $sp^3$ bonding in the thin film is adjusted to a desired value. The amount of the $sp^3$ bonding in the thin film can be arbitrarily adjusted in the film thickness direction by changing the bias voltage applied to the base material 10 during film formation. In contrast to this, a thin film (layer) in which the amount of the $sp^3$ bonding is uniform in the film thickness direction can be formed by maintaining the bias voltage applied to the base material 10 constant during film formation.

The second valve 910, the turbo molecular pump 908, the first valve 909, and the rotary pump 907 are connected to the film-forming chamber 900 in this order, and the above elements configure a vacuum system which controls the degree of vacuum (the degree of depressurization) in the inside of the film-forming chamber 900.

The thin films of the present embodiment can be manufactured using the film-forming apparatus 9, for example, in the following order.

The base material 10 is held using the base material holder 901 in the inside of the film-forming chamber 900. At this time, when the load lock method is used as described above, the base material 10 can be entered and removed while maintaining the degree of the vacuum in the inside of the film-forming chamber 900.

Next, the inside of the film-forming chamber 900 is depressurized. At this time, the inside can be subsequently depressurized by for example, in the initial phase of depressurization, opening the first valve 909 and the second valve 910 in a state in which the turbo molecular pump 908 is stopped, opening the rotary pump 907, and opening the turbo molecular pump 908 after a predetermined degree of depressurization is achieved. By doing so, the degree of vacuum in the inside of the film-forming chamber 900 can be readily controlled to a desired range.

Next, after the predetermined degree of vacuum is achieved, film formation is started. At this time, the base material 10 is preferably rotated with the base material holder 901 as described above. In addition, a bias voltage is applied to the base material 10 using the voltage source 911.

When the arc discharge is generated, a current is applied in a state in which the trigger 905 is brought into contact with the surface of the target 903, and an arc discharge is generated between the target 903 and the trigger 905 as described above. Then, the carbon ions 904 selected using the electromagnetic filter 906 were supplied to the base material 10, and a thin film is formed.

The amount of the $sp^3$ bonding in the thin film to be formed is determined by the energy of the carbon ions accelerated by the bias voltage. In addition, the amount of the $sp^3$ bonding can be arbitrarily adjusted in a range of approximately 50% to 85% by changing the bias voltage applied to the base material 10.

For example, it is possible to set the amounts of the $sp^3$ bonding in the thin film to approximately 62%, 72%, and 85% by setting the bias voltage to −1980 V, −660 V, and −66 V. Based on the above findings, the amount of the $sp^3$ bonding may be adjusted to a desired value by appropriately adjusting the bias voltage. As such, the unit structures can be formed by sequentially laminating thin films having different amounts of the $sp^3$ bonding in the film thickness direction, and the thin films of the present embodiment can be manufactured by laminating a plurality of the unit structures in the film thickness direction.

After a desired thin film is formed, applying a current to the trigger 905 is stopped, and the arc discharge is stopped, whereby film formation can be stopped. Next, the base material 10 on which the thin film is formed can be removed from the film-forming chamber 900.

Here, the method for manufacturing a thin film in a case in which a filtered arc ion plating-type film-forming apparatus is used has been described, but the method for manufacturing a thin film is not limited thereto, and for example, other physical vapor deposition methods, such as a sputtering method, may be applied.

Since the ta-C thin films of the present embodiment have a high hardness as described above, an excellent abrasion resistance, and a favorable effect of suppressing peeling from the base material, the ta-C thin films are preferable as a protective film in a mold for molding an optical element.

Figure 6:
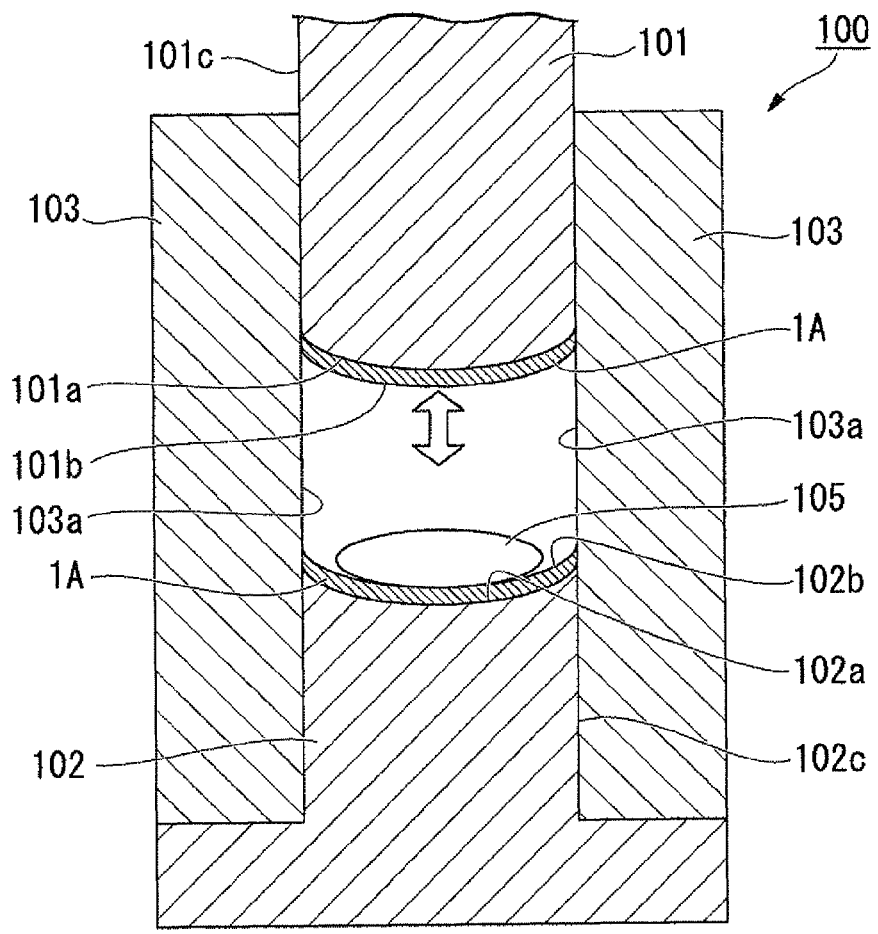
FIG. 6 is a schematic cross-sectional view exemplifying a mold for molding an optical element having the carbon thin film of the embodiment on the surface.

FIG. 6 is a schematic cross-sectional view exemplifying a mold for molding an optical element having the ta-C thin film of the present embodiment on the surface.

A mold for molding an optical element 100 shown in FIG. 6 is configured to have a top mold 101, a bottom mold 102, and a trunk mold 103, and all portions other than the ta-C thin film are made of, for example, a cemented carbide such as tungsten carbide (WC) or a ceramic such as SiC or $Si_3N_4$.

The trunk mold 103 is substantially tubular, and has a hollow portion into which the top mold 101 and the bottom mold 102 can be engaged. In addition, the inner surface 103a of the trunk mold forms a molding surface for molding a side surface of an optical element.

The top mold 101 has a substantially columnar engagement unit into the trunk mold 103, and the side surface 101c of the top mold slides on the inner surface 103a of the trunk mold 103 so as to be vertically slidable in the direction shown by the arrow. In addition, the thin film 1A, which is a ta-C thin film having the configuration of FIG. 1 described above, is formed on the bottom surface 101a of the top mold facing the bottom mold 102, and the surface of the thin film 1A forms a molding surface 101b of the top mold for molding the top surface of an optical element.

The bottom mold 102 has a substantially columnar engagement unit into the trunk mold 103, and the side surface 102e of the bottom mold is closely attached to the inner surface 103a of the trunk mold 103. In addition, the thin film 1A, which is a ta-C thin film having the configuration of FIG. 1 described above, is formed on the top surface 102a of the bottom mold facing the top mold 101, and the surface of the thin film 1A forms a molding surface 102b for molding the bottom surface of an optical element.

Meanwhile, the mold for molding an optical element is not limited to the mold shown here, for example, the top mold 101, the bottom mold 102, the trunk mold 103, the molding surface 101b of the top mold, the molding surface 102b of the bottom mold, and the inner surface 103a of the trunk mold may have any shape as long as it is possible to form an optical element into a desired shape. In addition, the ta-C thin film may be a thin film other than the thin film 1A, and may be different thin films at the top mold 101 and the bottom mold 102.

An optical element is manufactured using, for example, the mold for molding an optical element 100 in the following manner.

Firstly, an optical glass piece for a mold prepared as a subject to be molded 105 is mounted on the molding surface 102b of the bottom mold 102. Next, the subject to be molded 105 is heated to a temperature at which the subject to be molded can deform, the top mold 101 is lowered, the molding surface 101b of the top mold is brought into contact with the subject to be molded 105, a predetermined pressure is applied so as to transfer a mold shape determined by the top mold 101, the bottom mold 102, and the trunk mold 103 to the subject to be molded 105. Next, after the shape of the subject to be molded 105 is stabilized, the pressure is relieved, and the molded product is cooled to a temperature at which the molded product can be removed. Then, the molded product is removed from the mold for molding an optical element 100 so as to obtain an optical element.

EXAMPLES

Hereinafter, aspects of the invention will be described in more detail using specific examples. However, the examples simply show an example of the present embodiment of the invention, and the invention is not limited to the examples shown below.

<Manufacturing of the ta-C Thin Film>

Example 1

A 50 nm-thick layer at a bias voltage of −1980 V, a 50 nm-thick layer at a bias voltage of −660 V, and a 50 nm-thick layer at a bias voltage of −66 V were sequentially formed on a silicon wafer (Si substrate), which is a base material, as shown in Table 1 using the manufacturing apparatus shown in FIG. 5, and the above structure was laminated a total of two times (the number of repetitions was set to two) as a unit structure, thereby manufacturing a ta-C thin film (1).

Meanwhile, it was checked in advance that the amounts of the $sp^3$ bonding in the respective layers in cases in which the bias voltages are −1980 V, −660 V, and −66 V became 62%, 72%, and 85% respectively. The above checking was carried out in the same manner even in comparative examples described below.

In addition, the structures (unit structures) in Table 1 are indicated using the bias voltage during formation of the respective layers and the film thickness, and the left side indicates the "base material side", and the right side indicates the "side away from the base material". The above fact shall apply to the respective examples and comparative examples below as well.

Example 2

A ta-C thin film (2) was manufactured in the same manner as in Example 1 except that the film thicknesses of the respective layers were set to 25 nm instead of 50 nm, and the number of repetitions of the unit structure was four instead of two as shown in Table 1. At this time, a schematic view of the obtained ta-C thin film (2) is shown in FIG. 7A.

Example 3

A ta-C thin film (3) was manufactured in the same manner as in Example 1 except that the film thicknesses of the respective layers were set to 10 nm instead of 50 nm, and the number of repetitions of the unit structure was ten instead of two as shown in Table 1.

Example 4

A ta-C thin film (4) was manufactured in the same manner as in Example 1 except that the film thicknesses of the respective layers were set to 5 nm instead of 50 nm, and the number of repetitions of the unit structure was twenty instead of two as shown in Table 1.

Example 5

A 50 nm-thick layer at a bias voltage of −1980 V, a 50 nm-thick layer at a bias voltage of −660 V, a 50 nm-thick layer at a bias voltage of −66 V, and a 50 nm-thick layer at a bias voltage of −660 V were sequentially formed on a silicon wafer, which is a base material, as shown in Table 1 using the manufacturing apparatus shown in FIG. 5, and the above structure was laminated a total of 1.5 times (the number of repetition was set to 1.5), thereby manufacturing a ta-C thin film (5). That is, the ta-C thin film (5) had a first unit structure, in which the 50 nm-thick layer at a bias voltage of −1980 V, the 50 nm-thick layer at a bias voltage of −660 V, and the 50 nm-thick layer at a bias voltage of −66 V are laminated in this order, and a second unit structure, in which the 50 nm-thick layer at a bias voltage of −660 V, the 50 nm-thick layer at a bias voltage of −1980 V, and the 50 nm-thick layer at a bias voltage of −660 V are laminated in this order, laminated in this order.

Example 6

A ta-C thin film (6) was manufactured in the same manner as in Example 5 except that the film thicknesses of the respective layers were set to 25 nm instead of 50 nm, and the number of repetitions of the unit structure was three instead of 1.5 as shown in Table 1. Unlike in the ta-C thin film (5), in the ta-C thin film (6), it is possible to consider the repetitive structure as the unit structure. At this time, a schematic view of the obtained ta-C thin film (6) is shown in FIG. 7B.

Example 7

A ta-C thin film (7) was manufactured in the same manner as in Example 5 except that the film thicknesses of the respective layers were set to 10 nm instead of 50 nm, and the number of repetitions of the unit structure was 7.5 instead of 1.5 as shown in Table 1. That is, in the ta-C thin film (7), on the same unit structure as in the ta-C thin film (6), which was laminated repeatedly seven times on the silicon wafer, a 10 nm-thick layer at a bias voltage of −1980 V and a 10 nm-thick layer at a bias voltage of −660 V were further laminated in this order.

Example 8

A ta-C thin film (8) was manufactured in the same manner as in Example 5 except that the film thicknesses of the respective layers were set to 5 nm instead of 50 nm, and the number of repetitions of the unit structure was 15 instead of 1.5 as shown in Table 1.

The ta-C thin films of Examples 1 to 4 have a layer having an amount of the $sp^3$ bonding of 72% and an intermediate hardness (first intermediate layer) sandwiched between a relatively soft layer (flexible layer) having an amount of the $sp^3$ bonding of 62% and a hard layer (rigid layer) having an amount of the $sp^3$ bonding of 85%, and form a configuration in which a unit structure having a configuration in which the hardness is two-step gradient from soft to hard on the base material was repeatedly laminated.

In addition, the ta-C thin films of Examples 5 to 8 further have an additional layer, which have an amount of the $sp^3$ bonding of 72% and an intermediate hardness (second intermediate layer), further laminated on the uppermost layer of the unit structure in Examples 1 to 4, and particularly, in Examples 6 to 8, the ta-C thin films form a configuration in which a unit structure having a configuration in which the hardness is further gradient in three-step gradient from soft to hard on the base material is repeatedly laminated.

Comparative Example 1

A 300 nm-thick layer was formed at a bias voltage of −1980 V on a silicon wafer, which is a base material, as shown in Table 1 using the manufacturing apparatus shown in FIG. 5, thereby manufacturing a ta-C thin film (R1).

Comparative Example 2

A ta-C thin film (R2) was manufactured in the same manner as in Comparative example 1 except that the bias voltage was set to −660 V instead of −1980 V as shown in Table 1.

Comparative Example 3

A ta-C thin film (R3) was manufactured in the same manner as in Comparative example 1 except that the bias voltage was set to −66 V instead of −1980 V as shown in Table 1.

Comparative Example 4

A 50 nm-thick layer at a bias voltage of −1980 V and a 50 nm-thick layer at a bias voltage of −66V were formed on a silicon wafer, which is a base material, as shown in Table 1 using the manufacturing apparatus shown in FIG. 5, and the unit structure was laminated a total of three times (the number of repetitions was set to three), thereby manufacturing a ta-C thin film (R4).

Comparative Example 5

A ta-C thin film (R5) was manufactured in the same manner as in Comparative example 4 except that the film thicknesses of the respective layers were set to 25 nm instead of 50 nm, and the number of repetitions of the unit structure was set to six instead of three as shown in Table 1.

Comparative Example 6

A ta-C thin film (R6) was manufactured in the same manner as in Comparative example 4 except that the film thicknesses of the respective layers were set to 10 nm instead of 50 nm, and the number of repetitions of the unit structure was set to fifteen instead of three as shown in Table 1.

Comparative Example 7

A ta-C thin film (R7) was manufactured in the same manner as in Comparative example 4 except that the film thicknesses of the respective layers were set to 5 nm instead of 50 nm, and the number of repetitions of the unit structure was set to thirty instead of three as shown in Table 1.

The ta-C thin films of Comparative examples 1 to 3 have a uniform amount of the $sp^3$ bonding of 62%, 72%, and 85%.

In addition, the ta-C thin films of Comparative examples 4 to 7 form a configuration in which a relatively soft layer (flexible layer) having an amount of the $sp^3$ bonding of 62% and a hard layer (rigid layer) having an amount of the $sp^3$ bonding of 85% were alternately laminated.

was completely abraded or peeled off from the silicon wafer, the silicon wafer is exposed, and when the alumina balls began to slide on the silicon wafer, the coefficient of friction increases abruptly to 0.5 or more. That is, according to this method, it is possible to accurately check whether the ta-C thin film was lost from the sample by continuously measuring the coefficient of friction when the alumina balls were made to slide over time, and scanning the abrupt change in the coefficient of friction. Therefore, in the present evaluation, the period of time from when the alumina balls began to slide to when an abrupt change in the coefficient of friction occurred was measured and compared, thereby evaluating abrasion resistance.

In addition, a period of time in a case in which the load applied to the alumina balls was set to 1000 g (abrasion resistance (1)) and a period of time in a case in which the load applied to the alumina balls was set to 1500 g (abrasion resistance (2)) were measured for a plurality of samples, the average value was obtained and used as a measurement value. Evaluation of the abrasion resistance (1) is more preferable for detection of a finer difference in abrasion resistance than evaluation of the abrasion resistance (2). The evaluation results are shown in Tables 2 and 3.

TABLE 1

| | ta-C thin film | |
|---|---|---|
| | Structure [bias voltage (film thickness)] and the number of repetitions thereof | Total film thickness |
| Example 1 | [−1980 V (50 nm)/−660 V (50 nm)/−66 V (50 nm)] × 2 (← the side of the        the side away from base material         the base material →) | 300 nm |
| Example 2 | [−1980 V (25 nm)/−660 V (25 nm)/−66 V (25 nm)] × 4 | |
| Example 3 | [−1980 V (10 nm)/−660 V (10 nm)/−66 V (10 nm)] × 10 | |
| Example 4 | [−1980 V (5 nm)/−660 V (5 nm)/−66 V (5 nm)] × 20 | |
| Example 5 | [−1980 V (50 nm)/−660 V (50 nm)/−66 V (50 nm)/−660 V (50 nm)] × 1.5 | |
| Example 6 | [−1980 V (25 nm)/−660 V (25 nm)/−66 V (25 nm)/−660 V (25 nm)] × 3 | |
| Example 7 | [−1980 V (10 nm)/−660 V (10 nm)/−66 V (10 nm)/−660 V (10 nm)] × 7.5 | |
| Example 8 | [−1980 V (5 nm)/−660 V (5 nm)/−66 V (5 nm)/−660 V (5 nm)] × 15 | |
| Comparative example 1 | [−1980 V (300 nm)] × 1 | |
| Comparative example 2 | [−660 V (300 nm)] × 1 | |
| Comparative example 3 | [−66 V (300 nm)] × 1 | |
| Comparative example 4 | [−1980 V (50 nm)/−66 V (50 nm)] × 3 | |
| Comparative example 5 | [−1980 V (25 nm)/−66 V (25 nm)] × 6 | |
| Comparative example 6 | [−1980 V (10 nm)/−66 V (10 nm)] × 15 | |
| Comparative example 7 | [−1980 V (5 nm)/−66 V (5 nm)] × 30 | |

<Evaluation of the Properties of the ta-C Thin Films>

For the ta-C thin films of the respective examples and comparative examples, abrasion resistance, internal stress, and hardness were evaluated. The respective evaluation methods were as follows.

(Abrasion Resistance)

A ball on disk method was applied. That is, a certain load was applied to alumina balls having a diameter of 3/16 inches so that the alumina balls were pressed on a ta-C thin film of a sample (the ta-C thin film laminated on a silicon wafer), and the alumina balls were made to slide under conditions of a rotation radius of 2 mm and a rotation speed of 200 rpm. While the coefficient of friction with the ta-C thin film was an extremely small value of 0.1 or less, when the ta-C thin film (Internal Stress)

For a sample, the amount of a substrate deformed before and after film formation was measured three times, and the internal stress of the entire ta-C thin film was obtained using an ordinary calculation method using the Stoney formula. In addition, the average value was obtained and used as a measurement value. The evaluation results are shown in Tables 2 and 3.

(Hardness)

For a sample, the hardness was measured ten times using the nanoindentation method, and the average value was obtained and used as a measurement value. The evaluation results are shown in Tables 2 and 3.

TABLE 2

| | Abrasion resistance (1) (seconds) | | Abrasion resistance (2) (seconds) | | Internal stress (GPa) | Hardness (GPa) |
|---|---|---|---|---|---|---|
| | Measurement value | Average value | Measurement value | Average value | | |
| Example 1 | 14050 13740 | 13895 | 14500 14800 | 14650 | −2.06 | 39.2 |
| Example 2 | 23400 22700 | 23050 | 19600 17900 | 18750 | −1.82 | 34.3 |
| Example 3 | 17500 17800 | 17650 | 15800 12900 | 14350 | −1.59 | 30.9 |
| Example 4 | 17900 17100 | 17500 | 14000 19200 | 16600 | −1.16 | 29.5 |
| Example 5 | 9960 14630 | 12295 | 5330 9700 | 7515 | −1.56 | 31.7 |
| Example 6 | 24100 18015 | 21058 | 14800 16500 17600 16100 | 16250 | −1.81 | 36.3 |
| Example 7 | 25262 15500 | 20381 | 18200 11600 17600 | 15800 | −1.64 | 34.5 |
| Example 8 | 20800 21400 | 21100 | 17100 15100 | 16100 | −1.64 | 37.2 |

TABLE 3

| | Abrasion resistance (1) (seconds) | | Abrasion resistance (2) (seconds) | | Internal stress (GPa) | Hardness (GPa) |
|---|---|---|---|---|---|---|
| | Measurement value | Average value | Measurement value | Average value | | |
| Comparative example 1 | 8200 5900 6900 | 7000 | 110 10 4920 | 1680 | −0.73 | 26.2 |
| Comparative example 1 | 12200 13000 10100 | 11767 | 6440 6140 6460 | 6347 | −1.36 | 36.8 |
| Comparative example 3 | 9550 9700 11400 | 10217 | 10 3300 7050 | 3453 | −3.64 | 54.2 |
| Comparative example 4 | 27800 14600 | 21200 | 8140 5400 | 6770 | −2.25 | 38.3 |
| Comparative example 5 | 9950 9250 | 9600 | 14 8400 7450 | 5288 | −1.90 | 29.1 |
| Comparative example 6 | 9250 9400 | 9325 | 15 8 11 5500 4100 | 1927 | −1.34 | 34.7 |
| Comparative example 7 | 10000 13200 | 11600 | 15 95 3650 5250 58 5350 | 2403 | −0.87 | 30.0 |

Figure 8A:
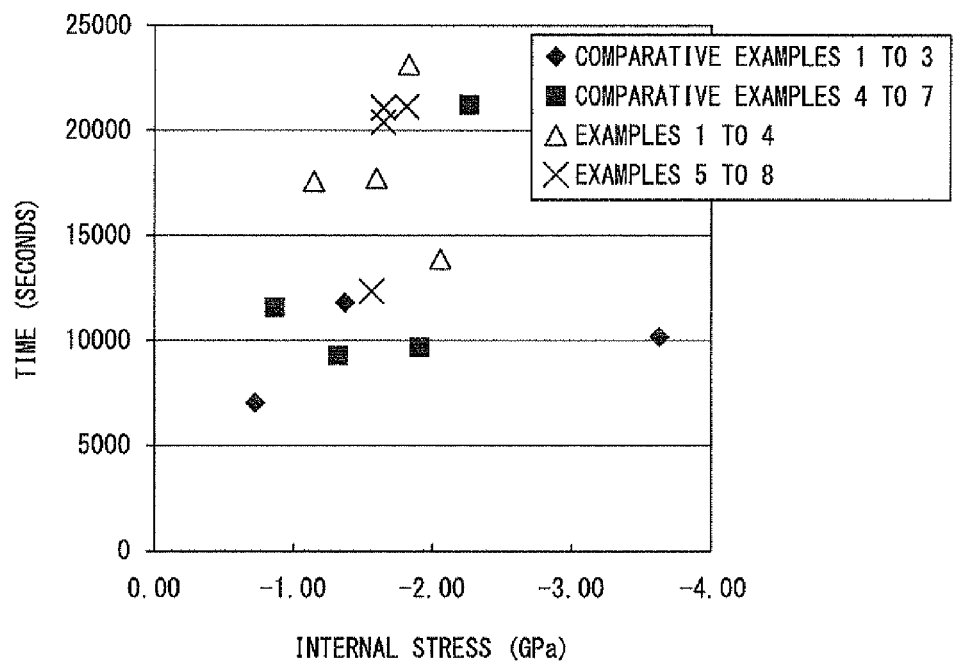
FIG. 8A is a graph expressing the relationship between the evaluation results (time) of abrasion resistance (1) and the internal stress in examples and comparative examples.
Figure 8B:
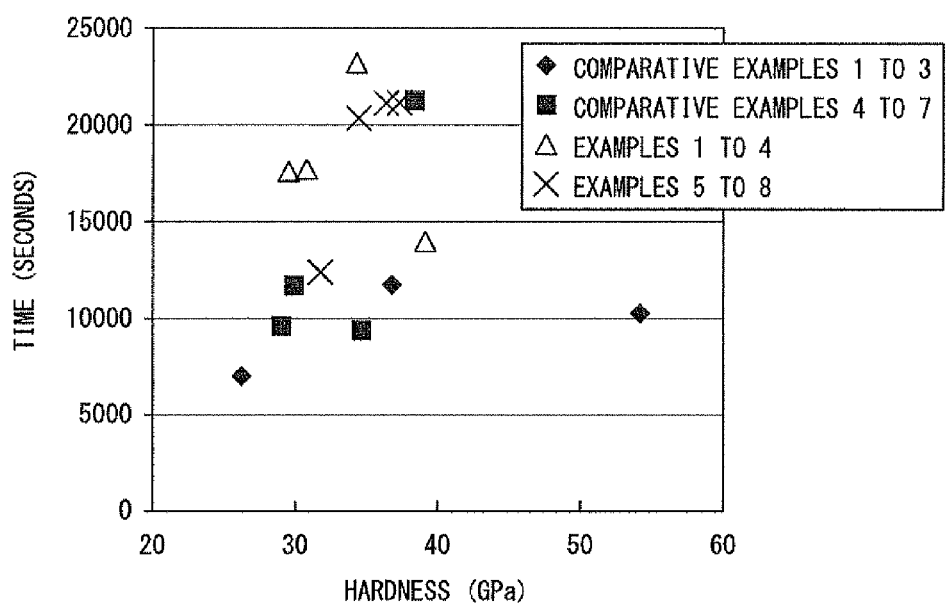
FIG. 8B is a graph expressing the relationship between the evaluation results (time) of abrasion resistance (1) and the hardness in examples and comparative examples.
Figure 9A:
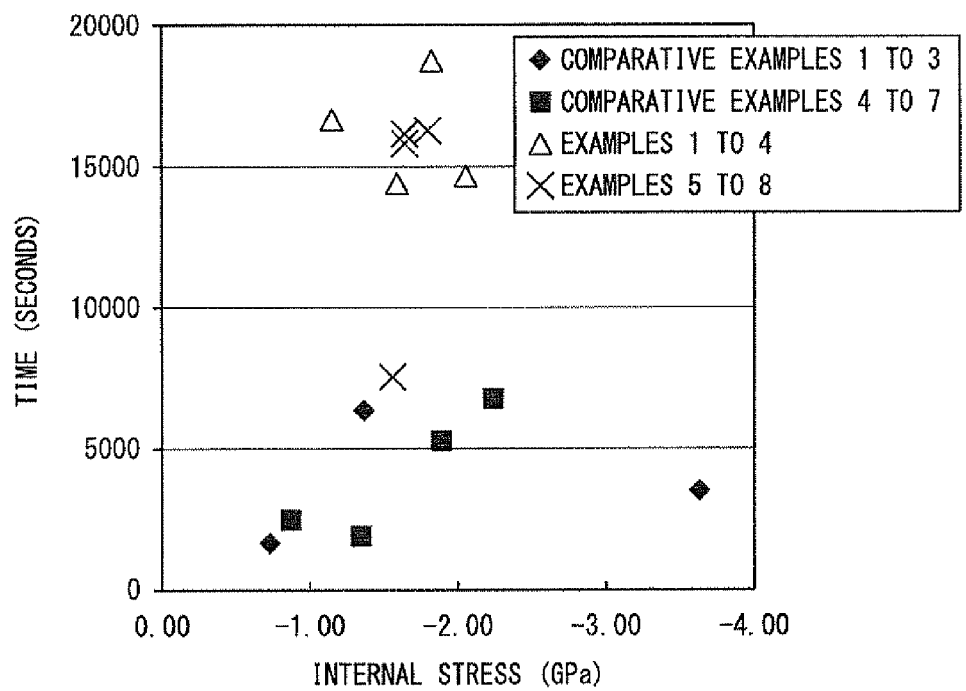
FIG. 9A is a graph expressing the relationship between the evaluation results (time) of abrasion resistance (2) and the internal stress in examples and comparative examples.
Figure 9B:
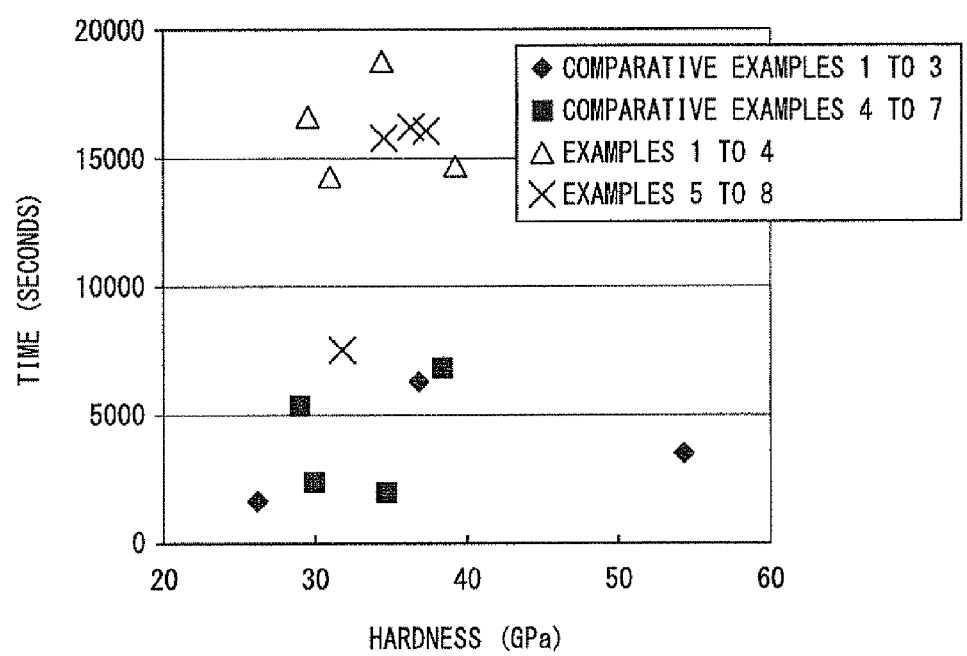
FIG. 9B is a graph expressing the relationship between the evaluation results (time) of abrasion resistance (2) and the hardness in examples and comparative examples.

Furthermore, the relationships between the evaluation results (time) of the abrasion resistance (1) and the internal stress and the hardness, and the relationships between the evaluation results (time) of the abrasion resistance (2) and the internal stress and the hardness were summarized. These relationships are shown in FIGS. 8A, 8B, 9A, and 9B. FIG. 8A shows the relationship between the evaluation results (time) of the abrasion resistance (1) and the internal stress. FIG. 8B shows the relationship between the evaluation results (time) of the abrasion resistance (1) and the hardness. FIG. 9A shows the relationship between the evaluation results (time) of the abrasion resistance (2) and the internal stress. FIG. 9B shows the relationship between the evaluation results (time) of the abrasion resistance (2) and the hardness.

As is evident from the above evaluation results, it could be confirmed that, for the ta-C thin films of the respective examples, the measurement value (average value) exceeded 12000 seconds in the evaluation of the abrasion resistance (1), the measurement value (average value) exceeded 7000 seconds in the evaluation of the abrasion resistance (2), the abrasion resistances were all excellent, and the effect of suppressing peeling from the base material was favorable. Particularly, it could be confirmed that there was a minor variation among the respective measurement values before the average values were obtained, and the effect of suppressing peeling from the base material could be stably exhibited. In addition, in the examples, it is considered that, in the layer formed first on the base material, the adhesion between the layer and the base material is strengthened by setting the bias voltage to a high value of −1980 V.

In addition, in Examples 2 to 4 of Examples 1 to 4, particularly in the results of the abrasion resistance (1), the measurement values (average values) became evidently larger than in Example 1. This is assumed to be because, since the film thicknesses (25 nm, 10 nm, and 5 nm) of the respective layers that configure the unit structure became thinner than in Example 1 (50 nm), and the ratio to the total film thickness became relatively small, the distribution of the hardness is averaged to be small, peeling from the base material is suppressed, and abrasion proceeds more uniformly, whereby the abrasion time is also stabilized.

In addition, Example 5 shows more decreased measurement values (average value) than other examples in the results of the abrasion resistances (1) and (2). However, it could be confirmed that, in any results, there was a minor variation among the respective measurement values before the average values were obtained, and the effect of suppressing peeling from the base material could be stably exhibited.

In contrast to this, for the ta-C thin films of the respective comparative examples, the measurement values of at least any one of the abrasion resistances (1) and (2) were significantly poor, and the effect of suppressing peeling from the base material was not sufficient. Particularly, while exceeding the measurement values of the examples in some cases, there was a significantly large variation among the respective measurement values before the average values were obtained, and the effect of suppressing peeling from the base material was significantly unstable.

The cause of the above results was assumed to be because, in Comparative examples 1 to 3, the thin films were a single layer film, and in Comparative examples 4 to 7, the thin films were alternately laminated films having different amounts of the sp$^3$ bonding such that there were many portions in which the hardness in the ta-C thin films abruptly changes.

In addition, it is evident from FIGS. 8 and 9 that the ta-C thin films show particularly excellent evaluation results of the abrasion resistances (1) and (2) with a hardness of at least approximately 27 GPa to 40 GPa, and an internal stress in a range of approximately −22 GPa to −1.0 GPa.

Meanwhile, the average value of the measurement values (average value) of the abrasion resistance (1) in Examples 1 to 4 was 18024 seconds, and the average value of the measurement values (average value) of the abrasion resistance (2) was 16088 seconds.

In addition, the average value of the measurement values (average value) of the abrasion resistance (1) in Examples 6 to 8 was 20846 seconds, and the average value of the measurement values (average value) of the abrasion resistance (2) was 16067 seconds.

In contrast to this, the average value of the measurement values (average value) of the abrasion resistance (1) in Comparative examples 1 to 3 was 9661 seconds, and the average value of the measurement values (average value) of the abrasion resistance (2) was 3827 seconds.

In addition, the average value of the measurement values (average value) of the abrasion resistance (1) in Comparative examples 4 to 7 was 12931 seconds, and the average value of the measurement values (average value) of the abrasion resistance (2) was 3341 seconds.

It is evident from the above results that the thin films having the respective unit structures of Examples 1 to 4, Example 5, and Examples 6 to 8 are superior to thin films of the related art in terms of the effect of suppressing peeling and abrasion resistance.

What is claimed is:

1. A carbon thin film made of tetrahedral amorphous carbon comprising:
   a plurality of unit structures in which three or more layers having mutually different amounts of $sp^3$ bonding in adjacent layers are laminated in a film thickness direction, excluding a unit structure in which two layers having different amounts of $sp^3$ bonding are alternately laminated,
   wherein a first layer having an amount of $sp^3$ bonding of less than 65%, a second layer having an amount of $sp^3$ bonding of 65% to less than 75%, and a third layer having an amount of $sp^3$ bonding of 75% or more are laminated in this order in all of the unit structures.

2. The carbon thin film according to claim 1, further comprising a fourth layer arranged on the third layer having an amount of $sp^3$ bonding of 65% to less than 75%.

3. The carbon thin film according to claim 1,
   wherein a hardness is 27 GPa to 40 GPa, and an internal stress is −2.2 GPa to −1.0 GPa.

4. The carbon thin film according to claim 1,
   wherein a film thickness is ⅓ or less of a total film thickness in all of the unit structures.

5. A mold for molding an optical element comprising:
   on thin film according to claim 1.

6. A method for manufacturing an optical element,
   wherein a subject to be molded is pressurized using the mold for molding an optical element according to claim 5 so as to form an optical element.

* * * * *